United States Patent
Matsushita

(10) Patent No.: US 7,570,086 B2
(45) Date of Patent: Aug. 4, 2009

(54) SWITCHING ELEMENT DRIVE CIRCUIT

(75) Inventor: Akihisa Matsushita, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 273 days.

(21) Appl. No.: 11/772,617

(22) Filed: Jul. 2, 2007

(65) Prior Publication Data
US 2008/0123382 A1     May 29, 2008

(30) Foreign Application Priority Data
Jul. 3, 2006    (JP)    ............................ 2006-183517

(51) Int. Cl.
*H03K 3/00*     (2006.01)
(52) U.S. Cl. .................. 327/108; 327/434; 318/254; 318/138
(58) Field of Classification Search ......... 327/108–112, 327/427, 434, 440, 502, 584, 379–381; 318/138, 318/254, 700, 798, 801, 808; 363/56.05, 363/57, 95, 96
See application file for complete search history.

(56) References Cited

U.S. PATENT DOCUMENTS

| | | | |
|---|---|---|---|
| 6,538,404 B2 * | 3/2003 | Kato et al. | 318/400.06 |
| 6,683,490 B2 * | 1/2004 | Kaminishi | 327/538 |
| 6,727,516 B2 * | 4/2004 | Katoh et al. | 257/47 |
| 7,038,500 B2 * | 5/2006 | do Nascimento | 327/108 |
| 7,365,579 B2 * | 4/2008 | Kimura et al. | 327/109 |

FOREIGN PATENT DOCUMENTS

| JP | 2003-69401 | 3/2003 |
|---|---|---|
| JP | 2005-86940 | 3/2005 |

* cited by examiner

*Primary Examiner*—Rajnikant B Patel
(74) *Attorney, Agent, or Firm*—Oblon, Spivak, McClelland, Maier & Neustadt, P.C.

(57) ABSTRACT

There are provided: a voltage division circuit (13) that performs voltage division of the voltage applied between the main electrodes of a non-latching switching element (11) having two main electrodes and a single control electrode at voltage division elements (14*a*) to (14*c*); a control current source (16) that injects current at the control electrode in accordance with the divided voltage of main voltage detection voltage division elements, of the voltage division elements (14*a*) to (14*c*) of the voltage division circuit (13) and a voltage division ratio control circuit (20) that adjusts the voltage division ratio of the main voltage detection voltage division elements (14*b*), (14*c*) of the voltage division circuit (13) in accordance with a control signal for controlling the switching element (11).

5 Claims, 5 Drawing Sheets

SWITCHING ELEMENT DRIVE CIRCUIT

CROSS-REFERENCE TO RELATED APPLICATION

This application claims benefit of priority from Japanese Application No. JP 2006-183517 filed Jul. 3, 2006, the entire contents of which are incorporated by reference herein.

BACKGROUND OF THE INVENTION

1. Field of the Invention

The present invention relates to a switching element drive circuit and in particular relates to a switching element drive circuit that drives a power switching element of a power converter.

2. Description of the Related Art

The field of application of power converters employing power switching elements has greatly expanded with the use of switching elements of increased capacity and increased speed. Recently, such power switching elements, in particular IGBTs (insulated gate bipolar transistors) and MOSFETs (metal-oxide-semiconductor field effect transistors), which are MOS gate type switching elements, become applicable on a wide scale.

IGBTs or MOSFETs are switching elements of the non-latching type in which the on/off condition does not continue of itself, and have the considerable advantage that higher controllability by the gate drive can be achieved compared with latching type switching elements such as thyristors. Such non-latching switching elements can suppress surge voltage or surge current by gate control, and control the current or voltage gradient in the transitional period of switching, even in the transitional period of turn-on/turn-off switching.

An example of application utilizing the distinctive features of such non-latching switching elements is a multiple series high voltage converter using the active gate drive technique. A multiple series high voltage converter realizes a high-voltage converter that can be employed in high-voltage applications such as power systems, by connecting a large number of elements of limited withstand-voltage in series. A multiple series voltage converter is, however, subject to the problem that large variations in the apportioned voltages are produced by even slight mismatching of the switching timings between the large number of series-connected elements. A way of dealing with this problem is using the active gate drive technique.

In the active gate drive technique, the voltage that is applied between the main electrodes of a power switching element is divided by resistances, so that these divided voltages are used as power sources and current is injected into the gate electrode in accordance with the voltages applied between the main electrodes of the power switching element: an example is disclosed in Japanese Patent Disclosure (kokai) No. 2005-86940.

In the example of this Japanese Patent Disclosure, the gate electrodes, which are the control input terminals of the switching elements, are connected with voltage amplifiers through gate resistances, and are connected also with the output of a control current source. The input of the control current source is connected with the output of the voltage amplifier and the collector/emitter voltage of the switching element obtained by voltage division by the voltage dividing resistance is applied to the input of the voltage amplifier. Thus, in the normal operating condition, the switching element performs on/off operation in accordance with the gate signal that is applied through the voltage amplifier, but, if surge voltage is generated when the switching element is turned off, the output current from the control current source is increased. The current that flows into the gate terminal of the switching element from the control current source increases the gate voltage of the switching element, thereby increasing the collector current of the switching element: as a result, the collector voltage of the switching element drops. Surge voltage of the switching element is suppressed by this action.

In another form of the active gate drive technique, in a power converter wherein IGBTs are connected in series, breakdown of the IGBTs by overvoltage due to voltage imbalance generated between the IGBTs when overcurrent flows through the series-connected IGBTs constituting the power converter is prevented increases the gate voltage when the collector voltage of an IGBT increases, so that, when the collector voltage becomes high, the gate voltage becomes higher than the gate voltage in the steady on condition of the IGBT. An example is disclosed in Laid-open Japanese Patent Disclosure (kokai) No. 2003-69401.

This Laid-open Japanese Patent Disclosure (kokai) relates to an element protection system when a short-circuiting fault occurs in a multiple series power converter consisting of this active gate drive technique. Usually, an IGBT is turned on or off by applying a pulse generated by a pulse generator of a gate circuit to the gate of the IGBT through a comparator. Thus, when a short-circuit occurs in an arm that is paired with an arm constituted by a plurality of IGBTs, the respective IGBTs are protected from excess applied voltage.

Since the same arm is constituted by a plurality of IGBTs, the same arm current flows in each of the IGBTs, so, depending on the variability of the properties of the IGBTs themselves, larger voltage may be applied to a specified IGBT than to other IGBTs. This occurs in an element whose IGBT saturation current value is smaller than that of other elements. When the applied voltage of this specified IGBT exceeds a prescribed value, the value of the voltage divided by the voltage dividing resistance exceeds the output voltage of the pulse generator. The comparator is arranged to output the higher voltage of its two inputs, so, since then, the gate voltage of the specified IGBT becomes a voltage higher than the ordinary on gate voltage. The saturation current value of an IGBT increases as the gate voltage rises, so the saturation current value of the specified IGBT rises, and, accompanying this, the voltage apportioned to the IGBT drops. In this way, the possibility of the voltage applied to the switching element exceeding the fixed value determined by the circuit in the event of a short-circuit is eliminated.

Thus, with the two Laid-open Japanese Patent Disclosure (kokai) s described above, feedback control in the gate drive circuit of the main voltage of the switching element prevent the switching element from being broken. In these systems, the set value of the voltage at which operation of the control circuit commences with respect to the voltage of the externally connected voltage division circuit is determined and the technique is adopted of performing control when the divided voltage is higher than this set value.

However, in the case of a power converter using switching elements, if the applied voltage is a DC voltage, the applied DC voltage may sometimes have a somewhat higher value than the rated voltage. Since, when such DC voltage is applied, protective action must not be performed unless required, the set value for protective action is restricted by the applied DC voltage. In other words, when the active gate technique is employed, the set value is set such that the control action is only performed when the voltage becomes even higher than this high voltage. The set value is therefore a higher value than the rated voltage and the time after surge voltage generated until commencement of control is therefore long. The loss generated in the switching element is thus increased corresponding to the prolongation of the time until commencement of control and it must be controlled in an overvoltage condition.

Next, the problem that arises in the event of short-circuiting will be described.

Usually, when a switching element is turned off, the voltage between the main electrodes of the switching element becomes an extremely low voltage determined by the switching element and the divided voltage also becomes close to 0 V. In contrast, in the event of a short-circuit of the switching element, voltage determined by the switching element and the short-circuit current are generated. Although the short-circuit current is determined by the characteristics of the switching element, this current is an extremely large current greater than the rated current by a factor of up to several times, to several tens of times. if such a large current continues to flow, the switching element is broken in a short time. Cases where the voltage of the voltage division resistance is high even after turn-on must therefore be regarded as cases of short-circuiting and protective action taken.

The voltage that is generated between the main electrodes of the switching element in the event of short-circuiting is low, as compared with the overvoltage level such as would break the switching element.

Consequently, even if voltage of the switching element in the event of short-circuiting is generated, this constitutes only a small change when observed by the voltage division circuit. Therefore there is a risk that the switching element may be broken due to be delayed to detect short-circuit.

SUMMARY OF THE INVENTION

Accordingly, an advantage of an aspect of the present invention is to provide a novel switching element drive circuit capable of suppressing surge voltage generated during turn-off of a switching element and capable of performing short-circuiting protection by detection of a short-circuiting condition at an early stage.

The above advantage is achieved by the following construction according to the present invention. Specifically, it comprises:

a voltage division circuit that performs voltage division of the voltage applied between the two main electrodes of a non-latching switching element having two main electrodes and a single control electrode at a plurality of voltage division elements;

a control current source that injects current at the aforesaid control electrode in accordance with the divided voltage of a main voltage detection voltage division element, of the voltage division elements of the voltage division circuit; and a voltage division ratio control circuit that adjusts the voltage division ratio between the main voltage detection voltage division element and another voltage division element of the aforesaid voltage division circuit in accordance with a control signal for controlling the aforesaid switching element.

According to the present invention, the surge voltage that is generated on turn-off of the switching element can be suppressed, and short-circuiting protection can be performed by detecting the short-circuit condition at an early stage.

BRIEF DESCRIPTION OF THE DRAWINGS

A more complete appreciation of the present invention and many of the attendant advantages thereof will be ready obtained as the same becomes better understood by reference to the following detailed description when considered in connection with the accompanying drawings, wherein.

DETAILED DESCRIPTION OF THE PREFERRED EMBODIMENTS

Figure 1:
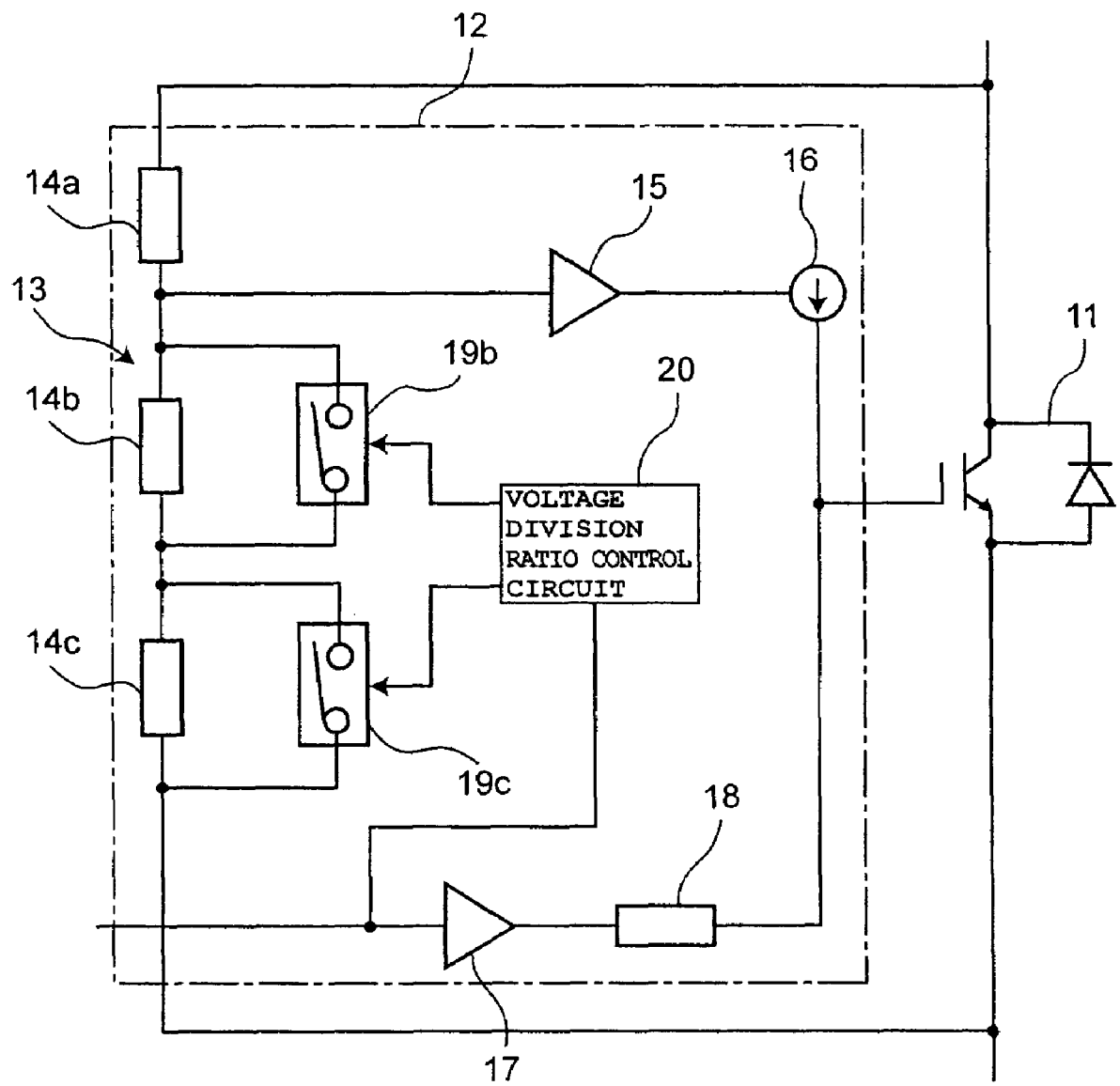
FIG. 1 is a layout diagram of a switching element drive circuit according to a first embodiment of the present invention.

Referring now to the drawings, wherein like reference numerals designate identical or corresponding parts throughout the several views, and more particularly to FIG. 1 thereof, one embodiment of the present invention will be described.

An embodiment of the present invention is described below with reference to the drawings.

First Embodiment

FIG. 1 is a layout diagram of a switching element drive circuit according to a first embodiment of the present invention. A gate electrode constituting a control electrode of the switching element 11 is provided with an active gate circuit 12 (indicated by the single-dotted chain lines). The active gate circuit 12 is connected between the two main electrodes of the switching element 11: the collector/emitter voltage of the switching element 11 is divided by voltage division elements 14a, 14b, 14c of a voltage division circuit 13, and the divided voltage of the main voltage detection voltage division elements 14b, 14c of the voltage division elements 14a, 14b, 14c of the voltage division circuit 13 is amplified by a voltage amplifier 15 and input to a control current source 16. Resistances or capacitors are employed as the voltage division elements 14a, 14b, 14c of the voltage division circuit 13.

The control current source 16 applies current to the control electrode of the switching element 11 in accordance with the divided voltage of the main voltage detection voltage division elements 14b, 14c. Furthermore, the control electrode of the switching element 11 inputs a control signal (gate voltage) for controlling the switching element 11, through a gate resistance 18, from a voltage amplifier 17.

Also, the main voltage detection voltage division elements 14b, 14c of the voltage division elements 14a, 14b, 14c of the voltage division circuit 13 are connected in parallel with bypass circuits 19b, 19c, so that the voltage division ratios of the voltage division elements 14a, 14b, 14c of the voltage division circuit 13 can be adjusted by turning the bypass circuits 19b, 19c on/off. A voltage division ratio control circuit 20 turns on/off of the bypass circuits 19b, 19c. Specifically, the voltage division ratio control circuit 20 adjusts the voltage division ratio of the voltage division elements 14a, 14b, 14c of the voltage division circuit 13 in accordance with the control signal for controlling the switching element 11.

In the normal operation, the switching element 11 turns on/off in accordance with the gate voltage that is applied through the voltage amplifier 17. But, when the surge voltage generated in turn-off of the switching element 11, the output current from the control current source 16 is increased. The gate voltage of the switching element 11 is thus raised by the current flowing into the gate electrode of the switching element 11 from the control current source 16, thereby increasing the collector current of the switching element 11. As a result, the collector voltage of the switching element 11 falls. The surge voltage of the switching element 11 is suppressed by this action.

The control signal for controlling the switching element 11 that is input to the voltage amplifier 17 is also input to the voltage division ratio control circuit 20. The voltage division ratio control circuit 20 is connected to the bypass circuits 19b, 19c and puts the bypass circuits 19b, 19c in on/off condition in accordance with the control signal.

Figure 2:
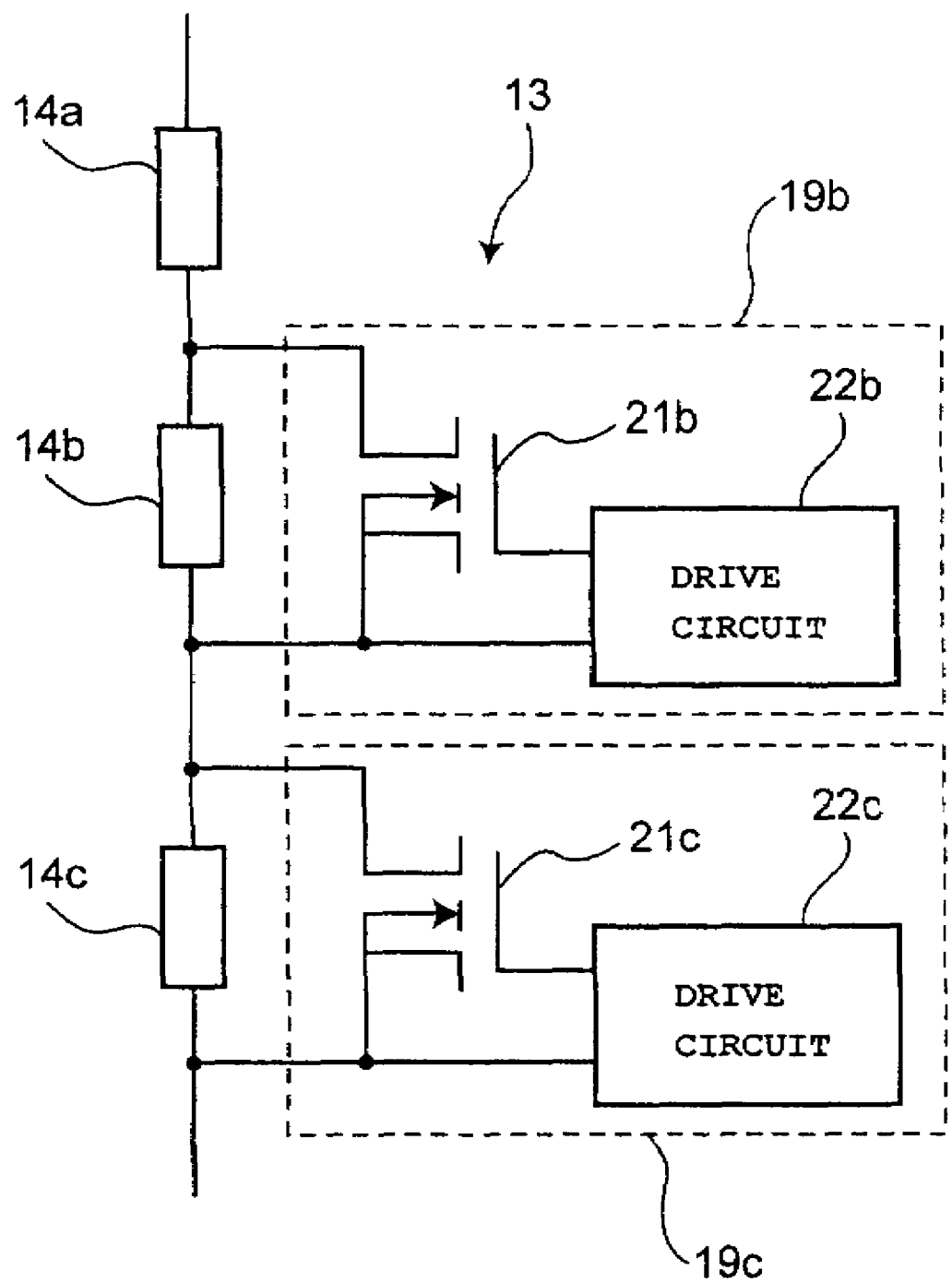
FIG. 2 is a detailed view of a voltage division circuit in the first embodiment of the present invention.

FIG. 2 is a detailed view of the voltage division circuit 13 according to the first embodiment of the present invention. Bypass circuits 19b, 19c are arranged in parallel with respect to the series-connected voltage division elements 14b, 14c. The bypass circuits 19b, 19c comprise switching elements 21b, 21c and drive circuits 22b, 22c, so that, whichever the switching elements 21b, 21c is turned on by the drive circuits 22b, 22c, the voltage division element 14b, 14c whose switching element 21b, 21c is turned on is short-circuited and its voltage division ratio thereby changed.

For example, when the bypass circuit 19b is turned on, the voltage division element 14b is short-circuited. Consequently, the voltage that is applied between the main electrodes of the switching element 11 is now divided by the voltage division elements 14a, 14c. Consequently, since the voltage that is input to the voltage amplifier 15 is the divided voltage at the voltage division element 14c, this voltage is now lower than that when the voltage was divided by the voltage division elements 14a, 14b, 14c. In this way, even though the voltage between the main electrodes is the same, the current flowing from the control current source 16 becomes smaller. Conversely, when the bypass circuit 19b is turned from on to off, the input voltage of the voltage amplifier 15 is increased, with the result that the current flow from the control current source 16 is also increased.

When a large current flows in the gate (control electrode) of the switching element 11, the switching element 11 tries to turn on, so the excess voltage is suppressed. Furthermore, since turn-on takes place more rapidly as the flow current to the gate (control electrode) becomes larger, overvoltage can be suppressed at an earlier stage by changing the voltage division ratio.

With the first embodiment, the voltage division ratio of the voltage division circuit 13 of the active gate circuit 12 can be changed in the transition period, so this makes possible detection of overvoltage generated between the main electrodes of the switching element 11 early and thereby enables suppression thereof to be performed early. Also, since the voltage division elements 14b, 14c of the voltage division circuit 13 can be bypassed or non-bypassing, by turning the switch elements 21b, 21c of the bypass circuits 19b, 19c on/off, adjustment of the voltage division ratio can be achieved by a straightforward circuit.

Second Embodiment

Figure 3:
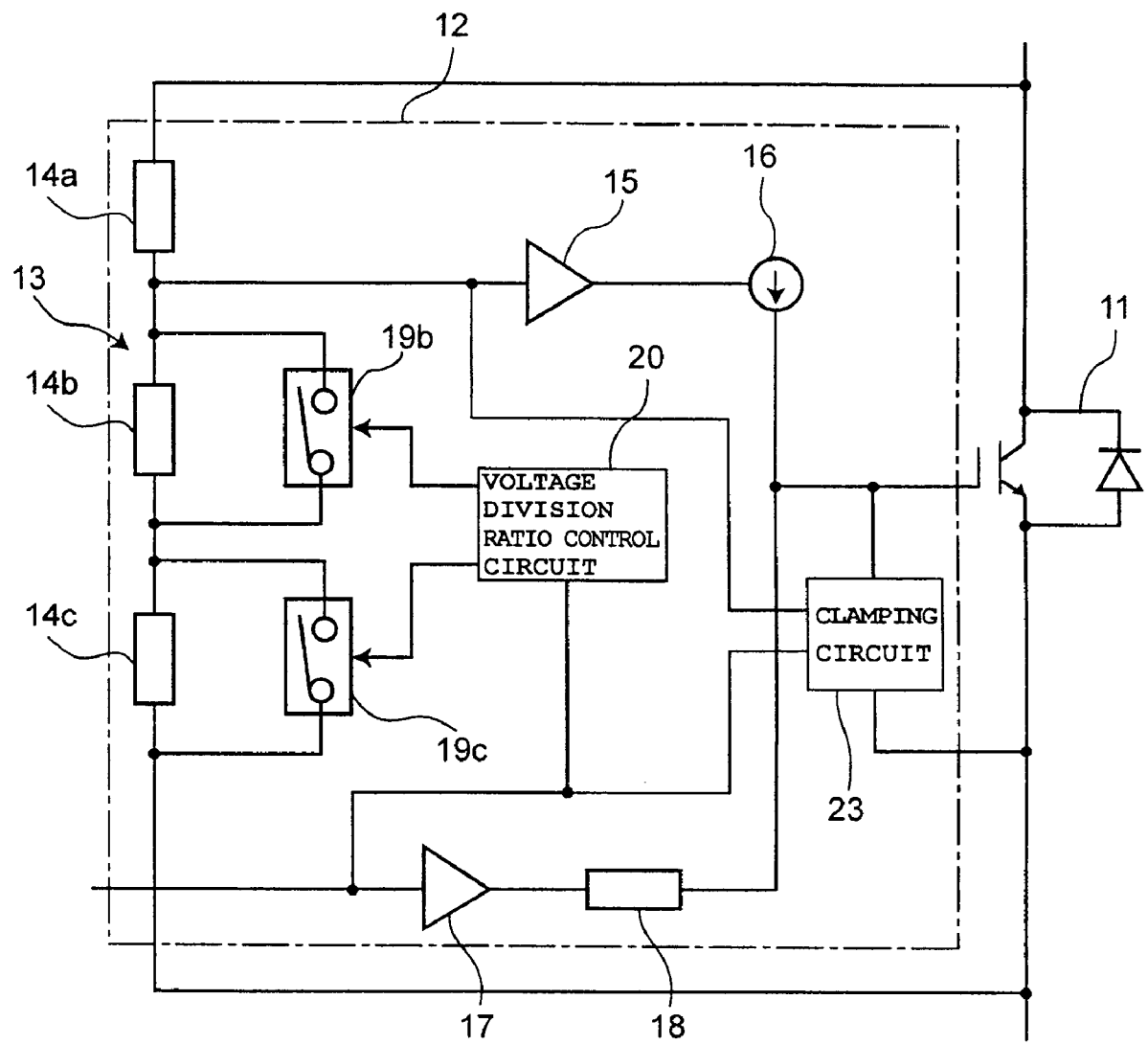
FIG. 3 is a layout diagram of a switching element drive circuit according to a second embodiment of the present invention.

FIG. 3 is a layout diagram of a switching element drive circuit according to a second embodiment of the present invention. In this second embodiment, compared with the first embodiment, a clamping circuit 23 is provided for clamping the gate voltage of the switching element 11 when the voltage of the main voltage detection voltage division elements 14b, 14c of the voltage division circuit 13 exceeds a prescribed value, and the voltage division ratio control circuit 20 is arranged to increase the voltage division ratio of the main voltage detection voltage division elements 14b, 14c of the voltage division circuit 13 immediately after turning-on of the switching element 11. Elements that are identical with corresponding elements in FIG. 1 are given the same reference symbols and repeated description is dispensed with.

When the switching element 11 is short-circuited, a current of several times the rated current flows in the switching element 11. A voltage determined by the characteristics of the switching element 11 is then generated between the collector and emitter of the switching element 11. In contrast, when the switching element 11 is turned on as normal without short-circuiting, no voltage is generated between the collector and emitter. Accordingly, short-circuiting can be identified when an on signal is input as the gate signal of the switching element 11 voltage is generated between the collector and emitter of the switching element 11, but the voltage between the collector and emitter of the switching element 11 that is generated in the event of short-circuiting is low in comparison with ordinary overvoltage.

Accordingly, in the second embodiment, the voltage division ratio is increased after input of an on signal as a gate signal (i.e. after turn-on). Since the voltage division ratio after turn-on of the switching element 11 is high, the voltage that is generated in the event of short-circuiting of the switching element 11 can be input to the clamping circuit 23 as a high voltage. In this way, detection of occurrence of short-circuiting becomes easy, and it becomes possible to suppress the gate voltage to the order of 10 V by using the clamping circuit 23 at an early stage. If the gate voltage is clamped to the order of 10 V in the event of short-circuiting, current determined by the characteristics of the switching element 11 flows in the switching element 11. This current is smaller than the current in the case of short-circuiting, so the switching element 11 cannot be broken by passage of this current. It is therefore possible to protect the switching element 11 from short-circuiting.

With the second embodiment, short-circuiting can be detected at an early stage by changing the voltage division ratio on turn-on of the switching element 11, so the switching element 11 can be protected.

Third Embodiment

Figure 4:
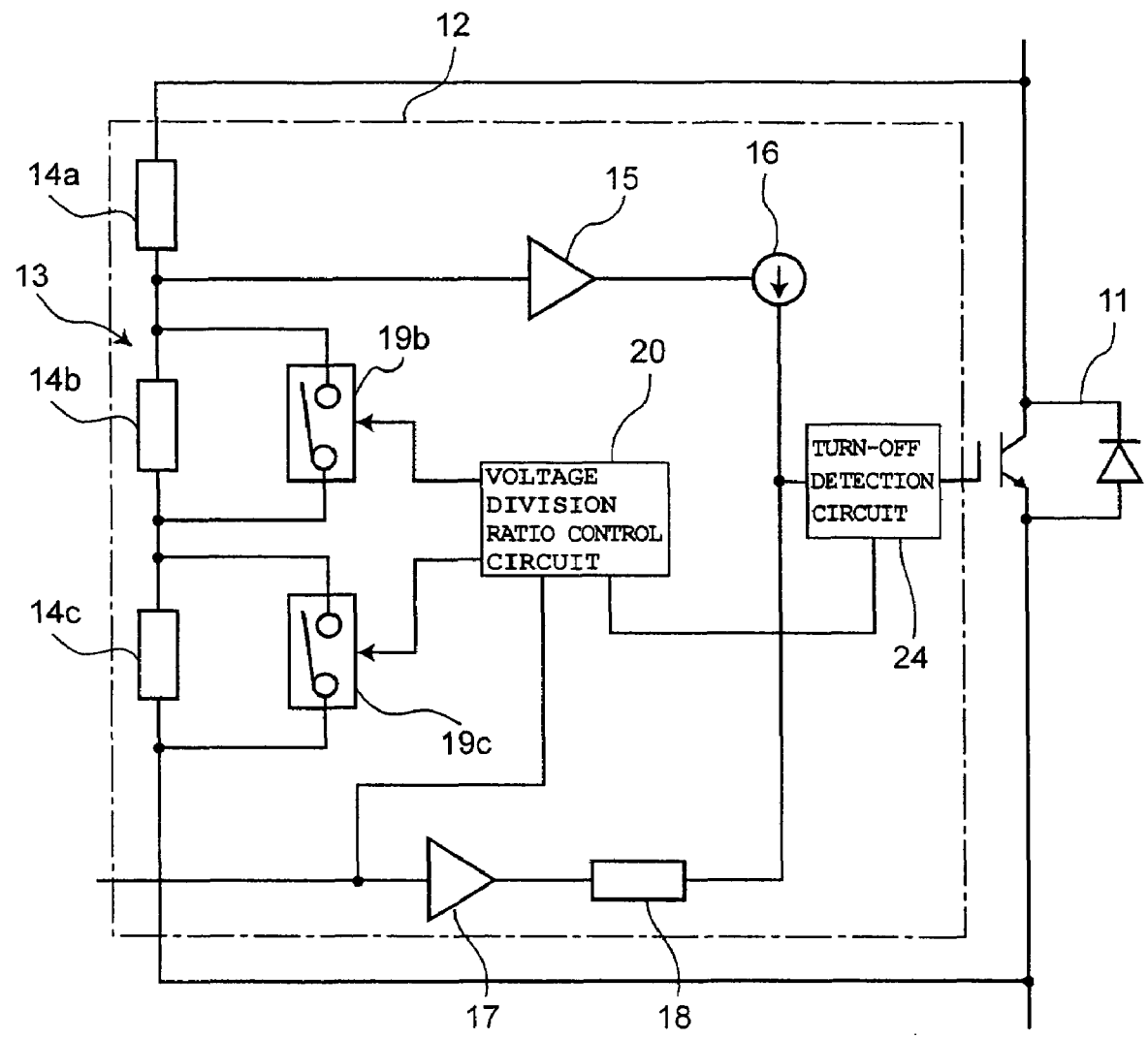
FIG. 4 is a layout diagram of a switching element drive circuit according to a third embodiment of the present invention.

FIG. 4 is a layout diagram of a switching element drive circuit according to a third embodiment of the present invention.

In this third embodiment, compared with the first embodiment, a turn-off detection circuit 24 is provided for detecting turn-off of the switching element 11 and the voltage division ratio control circuit 20 is arranged to increase the voltage division ratio of the main voltage detection voltage division elements 14b, 14c of the voltage division circuit 13 after turn-off of the switching element 11. Elements that are identical with corresponding elements in FIG. 1 are given the same reference symbols and repeated description is dispensed with.

In a circuit in which multiple switching elements 11 are connected in series, a specific switching element may be exposed to high voltage immediately after turn-off of the switching elements 11. This is determined by differences in the turn-off timing of the multiple series-connected switching elements 11 and/or the characteristics of the individual switching elements 11. Usually, surge voltage is suppressed using an active gate circuit 12, but this apportioned voltage is not suppressed.

In the event of suppression of surge voltage by the active gate circuit 12, current is injected to the gate (control electrode). The gate voltage is thereby raised, suppressing the surge voltage. Flow of current is discontinued when the current injected to the gate (control electrode) has become less than 0, and suppression of surge voltage is then concluded to have been completed. The timing of this is detected by a turn-off detection circuit 24 and input to the voltage division ratio control circuit 20. The voltage division ratio control circuit 20 then raises the voltage division ratio. In this way, in the transition period after generation of overvoltage on turn-off, gate current is injected with a voltage of the order of 100 V higher than the steady voltage, so current flow is performed when the apportioned voltage after turn-off has become high, making it possible to apportion voltage more uniformly.

With the third embodiment, it becomes possible to apportion the voltages apportioned after turn-off of the respective switching elements 11 more uniformly, by raising the detection sensitivity for generation of overvoltage after turn-off, by altering the voltage division ratio of the multiple series-connected switching elements 11 after turn-off.

Fourth Embodiment

Figure 5:
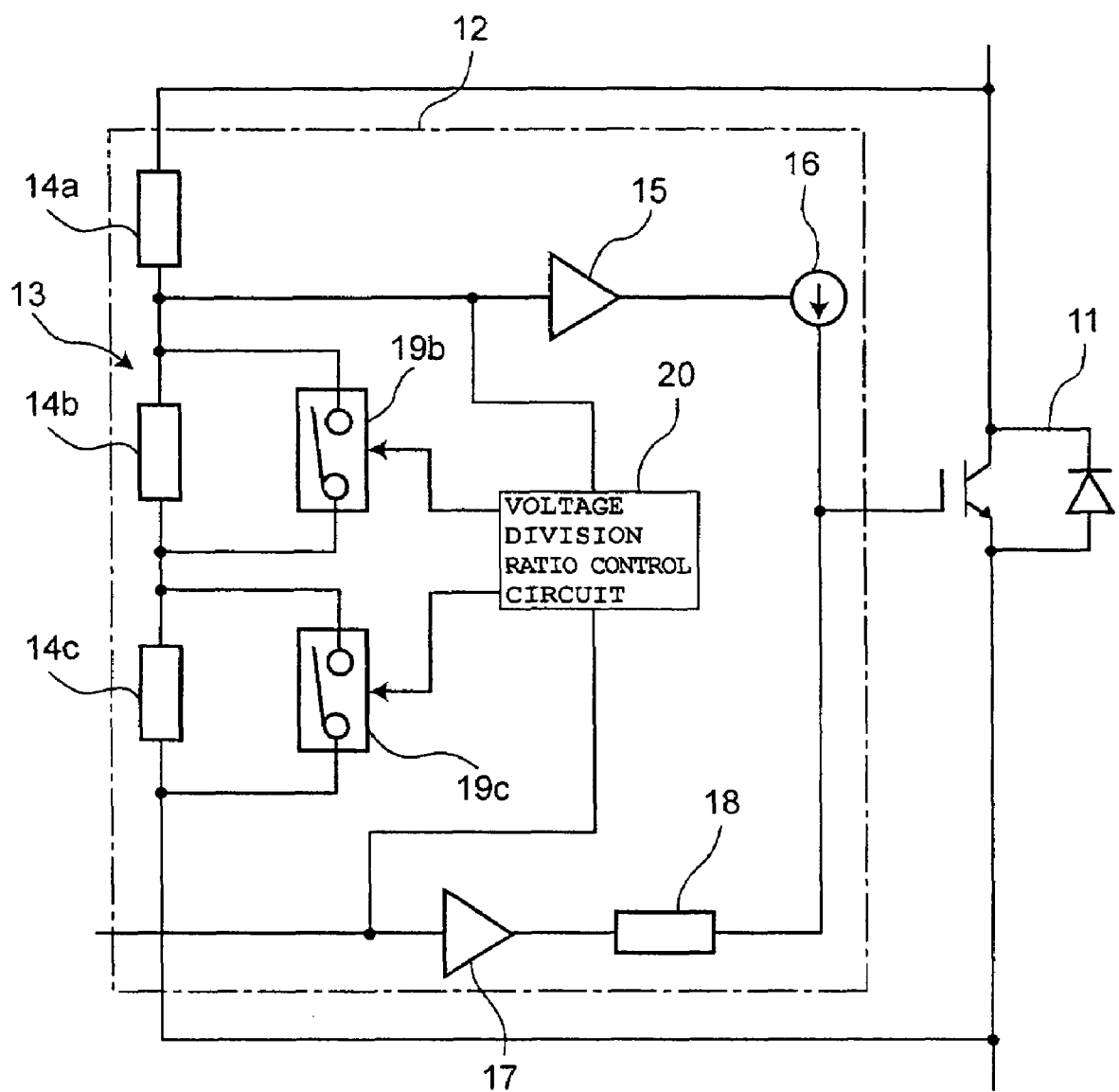
FIG. 5 is a layout diagram of a switching element drive circuit according to a fourth embodiment of the present invention.

FIG. 5 is a layout diagram of a switching element drive circuit according to a fourth embodiment of the present invention. In this fourth embodiment, compared with the first embodiment, the voltage division ratio control circuit 20 inputs the voltages of the main voltage detection voltage division elements 14b, 14c of the voltage division circuit 13 and lowers the voltage division ratio of the voltage division element 14a of the voltage division circuit 13 when the voltages of the main voltage detection voltage division elements 14b, 14c of the voltage division circuit 13 are higher than the rated voltage, but raises the voltage division ratio of the main voltage detection voltage division elements 14b, 14c of the voltage division circuit 13 when the voltages of the main voltage detection voltage division elements 14b, 14c of the voltage division circuit 13 are lower than the rated voltage.

In the case of a power converter using switching elements 11, sometimes not merely DC voltage of the rated value, but DC voltage higher than this may be applied. Consequently, normally, the voltage for initiation of operation by the active gate circuit 12 must be set to a voltage that is higher than this high DC voltage by an amount of the order of 100 V, in order that the active gate circuit 12 should not be activated merely by application of DC voltage.

Accordingly, in the fourth embodiment, the voltage divided by the voltage division element 14a of the voltage division circuit 13 is input to the voltage division ratio control circuit 20. Since the rated voltage of the equipment is fixed, if the voltages divided by the main voltage detection voltage division elements 14b, 14c are higher than the rated voltage, the voltage division ratio is lowered so that the active gate circuit 12 is activated from a higher voltage.

Contrariwise, the voltage division ratio is made capable of being adjusted matching the applied DC voltage, by raising the voltage division ratio when returning to the rated voltage from high voltage. In this way, adjustment to a suitable voltage division ratio can be achieved in both cases with both the rated voltage and voltage that is higher than this. Consequently, when surge voltage is generated, the active gate is actuated at an early stage to perform current flow, so suppression of the surge voltage can be effectively achieved.

With the fourth embodiment, suppression of surge voltage generated between the collector and emitter of the switching elements 11 can be achieved at an early stage by adjustment of the voltage division ratio in accordance with the voltage applied to the switching element 11.

In the various embodiments of the present invention described above, IGBTs have been taken as examples of the switching elements 11, but there is no restriction to IGBTs and the invention could of course be applied in the same way to any non-latching switching element controlled by voltage, such as for example a MOSFET.

Obviously, numerous additional modifications and variations of the present invention are possible in light of the above teachings. It is therefore to be understood that within the scope for the appended claims, the present invention may be practiced otherwise than as specially described herein.

What is claimed is:

1. A switching element drive circuit comprising:
   a voltage division circuit that performs voltage division of a voltage applied between two main electrodes of a non-latching switching element having said two main electrodes and a single control electrode at a plurality of voltage division elements;
   a control current source that injects current at said control electrode in accordance with a divided voltage of a main voltage detection voltage division element, of said voltage division elements of said voltage division circuit; and
   a voltage division ratio control circuit that adjusts a voltage division ratio with said main voltage detection voltage division element of said voltage division circuit in accordance with a control signal for controlling said switching element.

2. The switching element drive circuit according to claim 1, further comprising
   a clamping circuit provided for clamping a gate voltage of said switching element when a voltage of a main voltage detection voltage division element of said voltage division circuit exceeds a prescribed value, and
   wherein said voltage division ratio control circuit increases said voltage division ratio of said main voltage detection voltage division element of said voltage division circuit immediately after said switching element is turned on.

3. The switching element drive circuit according to claim 1, further comprising
   a turn-off detection circuit provided for detecting turn-off of said switching element, and
   wherein said voltage division ratio control circuit increases said voltage division ratio of said main voltage detection voltage division element of said voltage division circuit after turn-off of said switching element.

4. The switching element drive circuit according to claim 1, wherein said voltage division ratio control circuit makes said voltage division ratio of a main voltage detection voltage division element of said voltage division circuit low when a voltage of said main voltage detection voltage division element of said voltage division circuit is higher than a rated voltage and makes said voltage division ratio of said main voltage detection voltage division element of said voltage division circuit high when said voltage of said main voltage detection voltage division element of said voltage division circuit is lower than said rated voltage.

5. The switching element drive circuit according to any one of claim 1 to 4, further comprising
   a bypass circuit connected for bypassing said voltage division element in an event of adjustment of said voltage division ratio in parallel with another voltage division element apart from said main voltage detection voltage division element of said voltage division circuit.

* * * * *